(12) United States Patent
Lin et al.

(10) Patent No.: US 6,593,649 B1
(45) Date of Patent: Jul. 15, 2003

(54) METHODS OF IC REROUTING OPTION FOR MULTIPLE PACKAGE SYSTEM APPLICATIONS

(75) Inventors: Mou-Shiung Lin, Hsinchu (TW); Tah-Kang Joseph Ting, Hsinchu (TW)

(73) Assignee: Megic Corporation, Hsin-Chu (TW)

( * ) Notice: Subject to any disclaimer, the term of this patent is extended or adjusted under 35 U.S.C. 154(b) by 249 days.

(21) Appl. No.: 09/858,528

(22) Filed: May 17, 2001

(51) Int. Cl.⁷ ............................................... H01L 23/48
(52) U.S. Cl. ..................... 257/697; 257/692; 257/293; 257/781; 438/108; 438/613; 438/614; 438/617
(58) Field of Search ................... 257/781, 620, 257/697, 692; 438/18, 108, 613, 614

(56) References Cited

U.S. PATENT DOCUMENTS

| | | | |
|---|---|---|---|
| 5,026,664 A | * 6/1991 | Hongo et al. ............... 437/189 |
| 5,172,471 A | 12/1992 | Huang ........................ 29/840 |
| 5,567,655 A | 10/1996 | Rostoker et al. ............ 437/209 |
| 5,719,448 A | * 2/1998 | Ichikawa ..................... 257/781 |
| 6,002,163 A | * 12/1999 | Wojnarowski .............. 257/620 |
| 6,060,683 A | 5/2000 | Estrada ................... 219/121.69 |
| 6,204,074 B1 | * 3/2001 | Bertolet et al. ............... 438/18 |
| 6,207,548 B1 | * 3/2001 | Akram et al. ............... 438/613 |
| 6,287,893 B1 | * 9/2001 | Elenius et al. .............. 438/108 |

* cited by examiner

Primary Examiner—David Nelms
Assistant Examiner—Tu-Tu Ho
(74) Attorney, Agent, or Firm—George O. Saile; Stephen B. Ackerman

(57) ABSTRACT

A new method is provided for the creation of Input/Output connection points to a semiconductor device package. An extension is applied to the conventional I/O connect points of a semiconductor device, allowing the original I/O point location to be relocated to a new point of I/O interconnect that may be in the vicinity of the original point of I/O interconnect but can also be located at a distance from this original point of I/O interconnect. Layers of passivation and polyimide are provided for proper creation and protection of the extended and relocated I/O pads. Wire bonding is used to further interconnect the relocated I/O pads.

30 Claims, 4 Drawing Sheets

METHODS OF IC REROUTING OPTION FOR MULTIPLE PACKAGE SYSTEM APPLICATIONS

BACKGROUND OF THE INVENTION (1) Field of the Invention

The invention relates to the fabrication of integrated circuit devices, and more particularly, to a method of rerouting semiconductor device Input/Output (I/O) connections. This leads to a method of improved logistics control, whereby a variety of Integrated Circuit packages of different dimensions can be handled. The rerouting of the I/O pads of semiconductor devices is achieved by providing an extra layer of polyimide over which relocated pads are created, the relocated pads are attached to the standard pads on a semiconductor die using wire bonding.

(2) Description of the Prior Art

The design and manufacturing of semiconductor devices requires the cooperative application of a number of divers technologies. A large number of these technologies are aimed at creating semiconductor devices, other technical disciplines are aimed at packaging the semiconductor devices after these devices have been created. A major trend in the semiconductor technology has for many years been the reduction in device dimensions, which provides for improved device performance. Reduction in device dimension leads as a natural extension to increased device densities. From this it follows that the interconnection of semiconductor devices, which contain significantly increased functionality while the device is concurrently reduced in size, is a major challenge in the art. This challenge is addressed by the packaging of semiconductor devices, whereby changes in devices are closely followed by changes in the packages in which these devices are mounted. One of the key considerations in the package design is the accessibility of the semiconductor device or, to express this another way, the Input/Output (I/O) capability of the package after one or more devices have been mounted in the package.

The process of packaging semiconductor devices typically starts with a substrate that is ceramic or plastic based, the devices are mounted on the surface of the substrate while layers of interconnect lines and vias are formed that connect the devices to its surrounding circuitry. Many different approaches are known and have been used for the mounting and interconnecting of multiple semiconductor devices, such as Dual-In-Line packages (DIP's), Pin Grid Arrays (PGA's), Plastic Leaded Chip Carriers (PLCC's) and Quad Flat Packages (QFP's). Multi layer structures have further been used to connect physically closely spaced integrated circuits with each other. Using these techniques, a single substrate serves as an interconnect medium, multiple chips are connected to the interconnect medium forming a device package with high packaging density and dense chip wiring. The chip wiring contains layers of interconnect metal that are interconnected with interconnect vias, layers of dielectric (such as polyimide) or insulating layers separate metal layers that make up the interconnect network and the vias and contact points that establish connections between the interconnect networks. The design of overlying and closely spaced interconnect lines is subject to strict rules of design that are aimed at improving package performance despite the high density packaging that is used. For instance, electrical interference between adjacent lines is minimized or avoided by creating interconnect lines for primary signals that intersect under 90 degree angles. Surface planarity must be maintained throughout the construction of multi-layer chip packages due to requirements of photolithography and package reliability. Many of the patterned layers within a layered structure form the base for overlying layers, lack of planarity can therefore have a multiplying effect on overlying layers.

The Quad Flat Package (QFP) has been created to achieve high pin count integrated packages with various pin configurations. The pin I/O connections for these packages are typically established by closely spaced leads distributed along the four edges of the flat package. This limits the I/O count of the packages and therefore the usefulness of the QFP. The Ball Grid Array (BGA) package has been created whereby the I/O connects for the package are distributed around the periphery of the package and over the complete bottom of the package. The BGA package can therefore support more I/O points and provides a more desirable package for high circuit density with high I/O count. The BGA contact points are solder balls that in addition facilitate the process of flow soldering of the package onto a printed circuit board. The solder balls can be mounted in an array configuration and can use 40, 50 and 60 mil spacings in a regular or staggered pattern.

Another packaging concept is realized with the use of so-called flip chips. The flip chip is a semiconductor device that has conductive layers formed on its top surface, external electrical interconnects can be made to these conductive layers by wire bonding selected points of the conductive layers to surrounding circuitry or interconnect lines. For instance, if CMOS devices are created using the flip chip concept, the VSS and VDD voltage that is needed for the operation of the device can be supplied through selected vias or contact pads in the top surface of the CMOS device. The top surface of the flip chip is further provided with so-called solder bumps. At the time of assembly of the flip chip, the chip is turned over (flipped over) so that the solder bumps are now facing downwards and toward the circuit board, typically a printed circuit board, on which the flip chip is to be mounted. The solder bumps (on the now downward facing surface of the flip chip) are aligned with and brought into contact with contact pads that are for this purpose created in the top surface of the circuit board. The solder bumps are, by means of solder reflow or any other means, connected to the contact pads of the circuit board.

In advanced microelectronic packaging of integrated circuits, particularly high-speed, high-density packaging for main frame computer applications, the chips are often mounted on multi-chip modules such as polyimide substrates, which contain buried wiring patterns to conduct electrical signals between various chips. These modules usually contain multiple layers of interconnect metallization separated by alternating layers of an isolating dielectric whose function is to serve as electrical isolation between the metal features. Any conductor material that is used in a multilevel interconnect has to satisfy certain essential requirements such as low resistivity, resistance to electromigration, adhesion to the underlying substrate material, stability (both electrical and mechanical) and ease of processing.

It is clear from the above that, in a typical semiconductor device package, the device can be mounted or positioned in a package and further connected to interconnect lines of the device package by bond wires or solder bumps. For this purpose the to be packaged semiconductor device is provided with pads (bond pads) that are, for ease of access, mounted around the perimeter of the device. Wires are connected from the bond pads to the supporting circuit board or to other means of providing interconnect lines such as Tape Automated Bonding (TAB) device packages. For the packaging techniques that are used, the requirements that are imposed on the method of packaging universally address the same concerns and limitations. These concerns and limitations are imposed by considerations of the (type of) device that is being packaged, by the number of the devices that are mounted within one package, by electrical performance of the individual devices in the package and the impact of the package on the electrical performance, by thermal considerations and the like. In addition, the cost that is incurred in creating semiconductor packages may have a significant impact on the package that is used. For this reason, universality of the package, whereby the package can be used to package a variety of different semiconductor devices, is a desired objective. In addition and most importantly, the package must be of a nature where the package protects the packaged device from the environment.

The Thermal Coefficient of Expansion (TCE) that is in force for both the semiconductor device and the package in which the semiconductor device is mounted must be such that no undue thermal stress is exerted on the device or any of its components such as contact balls or solder bumps. With increasing temperature, the semiconductor device expands as do the surrounding components of leadframe (molded plastic based, TAB based or other) and the main body of the package. If the relative expansion of these components differs considerably, a great amount of stress may be introduced at the points where the semiconductor device interfaces with the package, typically solder balls or solder bumps. This stress can lead to solder ball fatigue and eventual damage to or destruction of the solder ball.

It has already been pointed out that many of the considerations that go into the design of a semiconductor package are driven by I/O availability. For this reason, many of the device packages have the bond pads located along the periphery of the die which allows for an increase in the number of I/O connections that can be established to the package. In addition, the Ball Grid Array device further enhances the availability of the number of I/O connections for a package. The number of I/O points that can be connected to a package is further enhanced if the contact pads (bond pads) that are used for the I/O interconnects are reduced in size. Reliability considerations however limit the reduction that can be applied to the size of the bond pads.

Many of the electrical performance parameters are determined by the length of the path that electrical signals have to travel over interconnects, including bond pads and I/O's. In general, the shorter the path that is traveled, the less the impact of resistive voltage drop and parasitic capacitance. Special arrangements are therefore frequently made to shorten the paths that signals have to travel inside a package, one of these arrangements is the creation of a bond pad buffer zone that serves as the interface between the semiconductor die and the bond pads that interconnect the die.

U.S. Pat. No. 5,172,471 (Huang) shows a die with standard pads.

U.S. Pat. No. 5,567,655 (Rostoker et al.) shows a zig-zag layout of I/O pads.

U.S. Pat. No. 6,060,683 (Estrada) shows a process to remove a dielectric layer over a panel. However, this reference differs from the present invention.

SUMMARY OF THE INVENTION

A principle objective of the invention is to provide a method of I/O pad relocation that allows for the packaging of semiconductor devices of different dimensions while using a more universal package.

Another objective of the invention is to provide improved packaging capability and the therefrom following improved manufacturing capability of semiconductor devices.

Yet another objective of the invention is to provide a method of packaging semiconductor devices that allows for the use of more cost effective tools and equipment while the method of the invention of packaging semiconductor devices can be implemented in a clean room environment of less stringent requirements of room environmental control.

A still further objective of the invention is to provide a method of pad relocation that can be implemented in a processing sequence after the process of device passivation, allowing for improved inventory control.

A still further objective of the invention is to provide a method of pad relocation that further enhances the reliability of wire bond operations.

In accordance with the objectives of the invention a new method is provided for the creation of Input/Output connection points to a semiconductor device package. An extension is applied to the conventional I/O connect points of a semiconductor device, allowing the original I/O point location to be relocated to a new point of I/O interconnect that may be in the vicinity of the original point of I/O interconnect but can also be located at a distance from this original point of I/O interconnect. Layers of passivation and polyimide are provided for proper creation and protection of the extended and relocated I/O pads. Bond wires are used extensively as part of the invention to interconnect the original I/O points of interconnect with the relocated I/O points of interconnect.

DESCRIPTION OF THE PREFERRED EMBODIMENTS

The method of the invention focuses on considerations of I/O connect that apply to semiconductor device packages. The invention specifically addresses the packaging concern of providing a package that has I/O points of connection that can be used in a flexible manner, this flexible manner being dependent in its implementation on using bond wires.

The process of the invention makes use of the deposition of a thick, soft layer of dielectric material such as a layer of polyimide over which relocated I/O pads are formed. Since polyimide is one of the suggested materials that can be used for this purpose, some of the salient features of polyimide will be highlighted at this time. These features are assumed to be equally applicable to any other material that is selected for this thick, soft layer of dielectric.

Polyimide films as inter-level dielectrics are used in the art as a technique for providing partial planarization of a dielectric surface. Polyimides are known to have the following characteristics:

- polyimides produce surfaces in which the step heights of underlying features are reduced, and step slopes are gentle and smooth,
- polyimides can be used to fill small openings without producing voids that occur when low-temperature CVD oxide films are deposited,
- cured polyimide films can tolerate temperatures of up to 500 degrees C. without degradation of their dielectric film characteristics,
- polyimide films have dielectric breakdowns, which are only slightly lower than that of $SiO_2$,
- polyimides have a the dielectric constant that is smaller than the dielectric constant of silicon nitride and of $SiO_2$, and
- the process used to deposit and pattern polyimide films is relatively simple.

Polyimide is a frequently used dielectric, and is an example of an organic polymeric material. Other such dielectrics are for instance silicon dioxide (doped or undoped), silicon oxynitride, parylene or polyimide, spin-on-glass, plasma oxide or LPCVD oxide.

The processing of polyimide is well understood in the semiconductor and is frequently applied to give extra protection to the surface of a silicon chip against scratching, cracking and other types of mechanical damage. Most often, mechanical damage may occur during assembly, packaging or any subsequent handling of the die. As a passivation layer, polyimide also guards against thin film cracking, which frequently results from the packaging of very large die into plastic packages. Existing polyimide processes are further compatible with standard forms of wire bonding technology.

Figure 1:
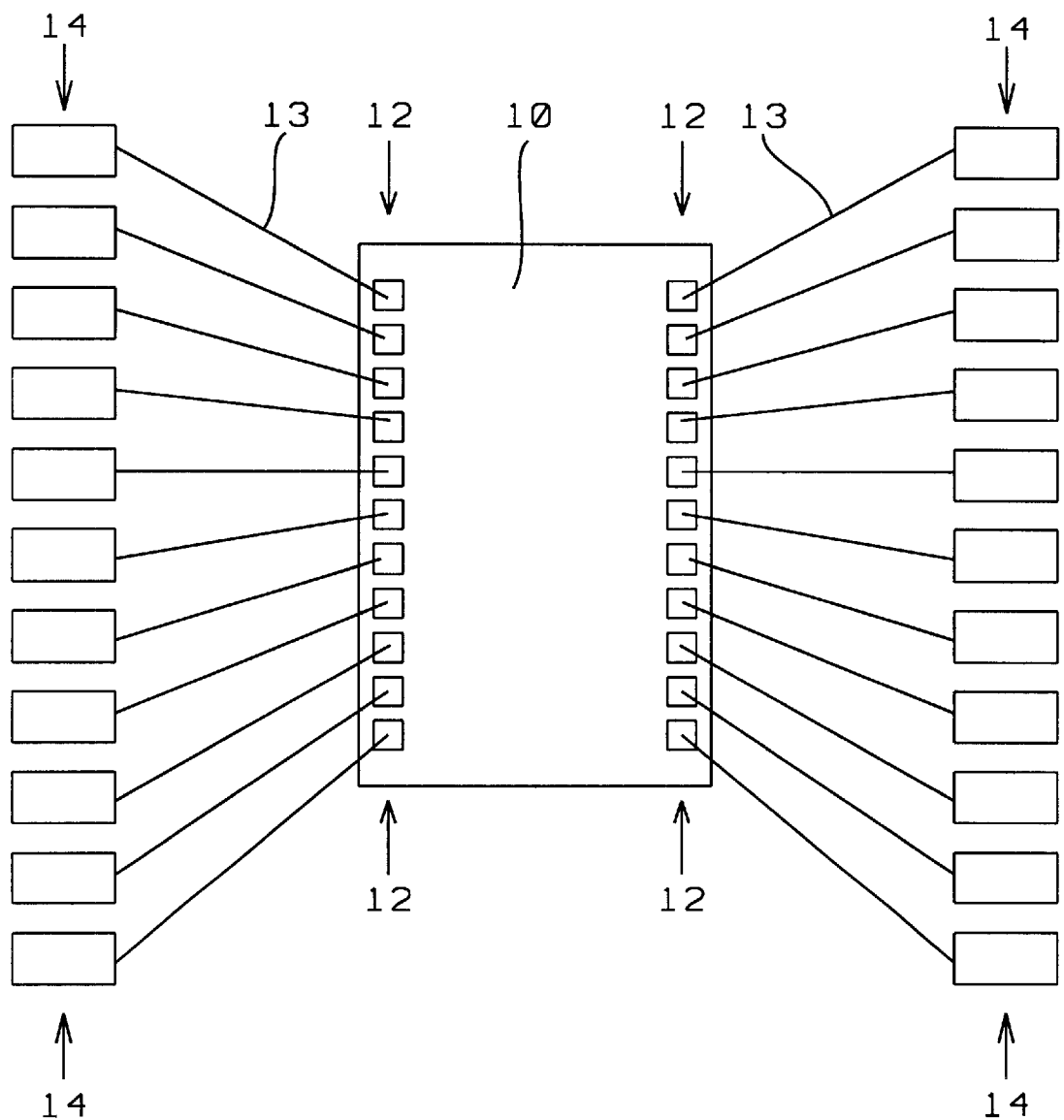
FIG. 1 shows top view expanded into a three-dimensional view of an original pad design and layout, the three-dimensional view shows the interconnects of the original pads to I/O points via bond wires.

Referring now specifically to FIG. 1, there is shown a three dimensional view of an original pad design and layout. Pads 12 are I/O pads that are created on a semiconductor surface 10, pads 12 are connected via bond wires 13 to the points 14 of I/O interconnect on the package in which the semiconductor device is packaged. The semiconductor surface 10 can be any surface that is part of a semiconductor structure and can typically be the surface of a semiconductor substrate. Pads 12 are arranged around the perimeter of surface 10 in one dimension, the process of the invention is not limited to one dimension so that I/O pads under the process of the invention can be arranged in two dimensions whereby these two dimensions may or may not intersect under an angle of 90 degrees. In short: the I/O pads of the invention can be located any place on a semiconductor surface.

Figure 2:
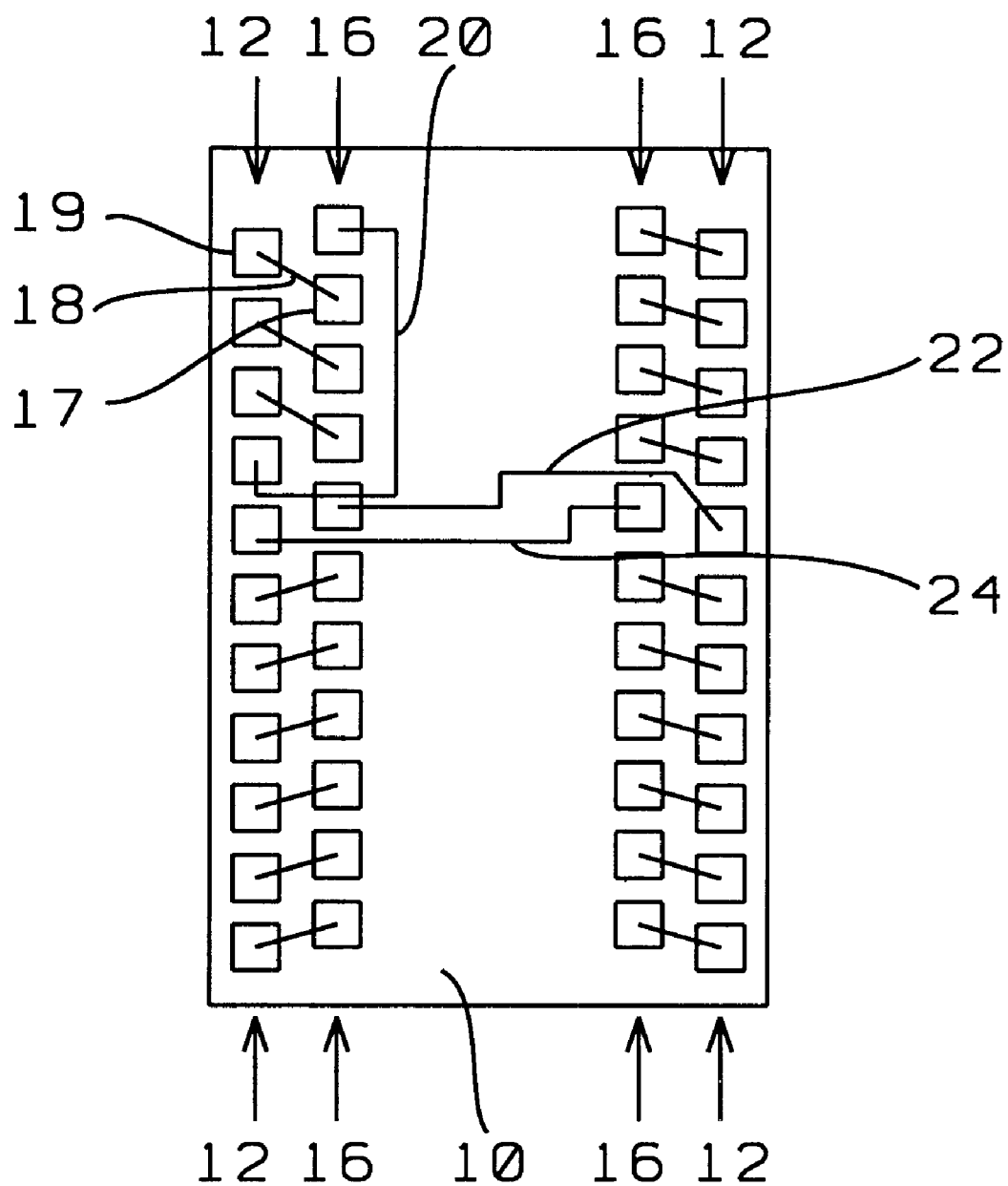
FIG. 2 shows a top view after I/O pad re-routing, resulting in I/O pad relocation by using bond wires.

FIG. 2 shows a top view after I/O pad re-routing resulting in I/O pad relocation. The pads that are highlighted as pads 12 are the original pads that have been created on surface 10, pads 16 are the relocated pads that have been relocated using the process of the invention. It must be noted that the relocated pads 16 do not need to be connected to original pads 12 that are in the immediate vicinity of the relocated pads. For instance, while most relocations of the I/O pads follow the pattern that is shown by the relocation 18 (the relocated pad 17 is in close proximity to the original pad 19), this is not the case with the relocations that are affected by relocations 20, 22 and 24. The relocations that are shown in FIG. 2 are shown only as examples of possible relocations and in no way limit the relocations that can be achieved using the method of the invention. The relocation interconnections 20, 22 and 24 preferably use bond wires.

Figure 3:
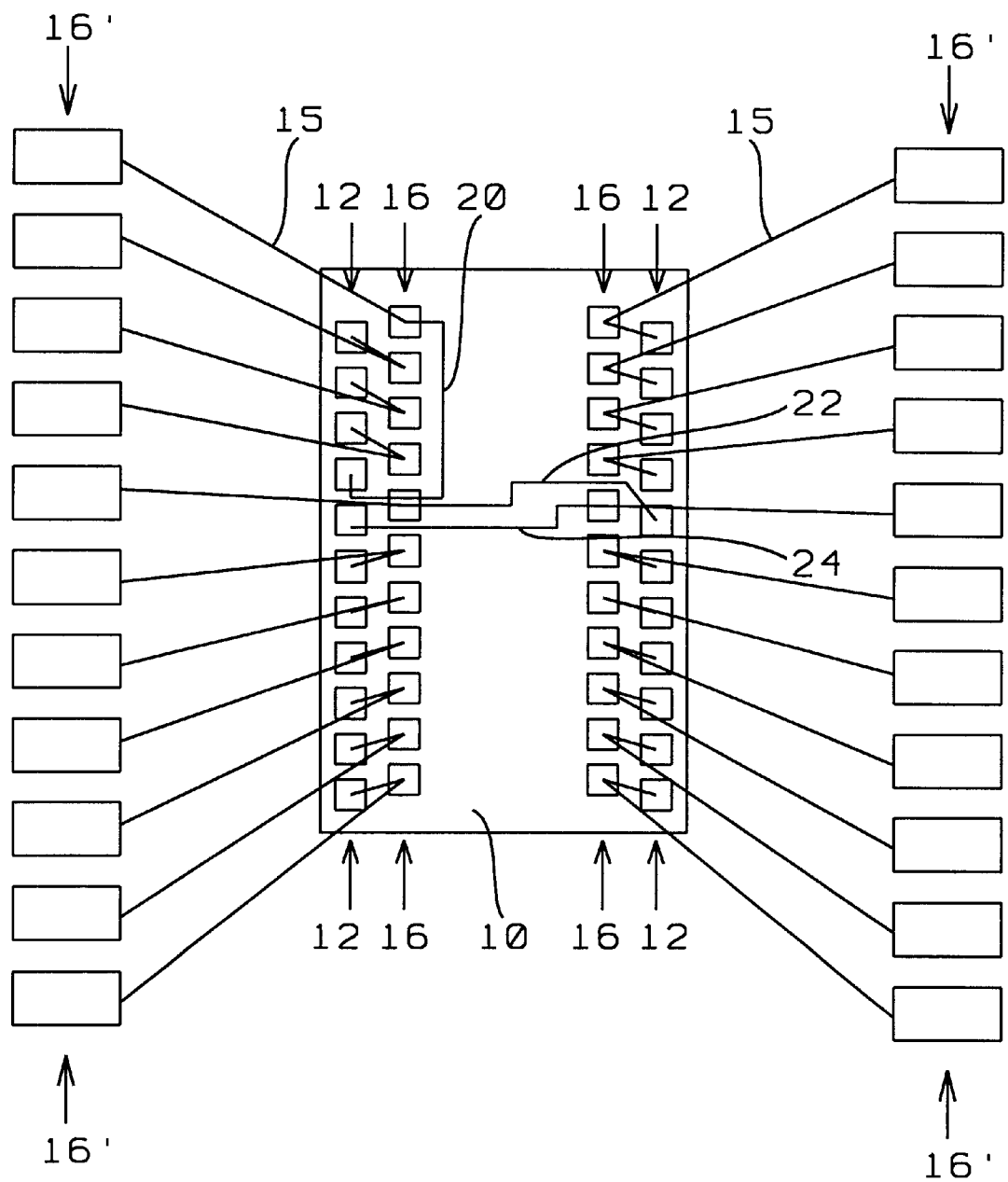
FIG. 3 shows a three-dimensional view of relocated I/O pads while also showing a top view of the original and the relocated I/O pads, the three-dimensional view shows the interconnects of the relocated pads to I/O points via bond wires.

FIG. 3 shows a three dimensional view of the relocated I/O pads while at the same time showing a top view of the original and the relocated I/O pads. The center portion of the view that is shown in FIG. 3 is identical to the top view that is shown in FIG. 2, pads 16 are connected via bond wires 15 to the points 16' of I/O interconnect on the package in which the semiconductor device is packaged.

One point that has already been mentioned but that deserves being stated again is that the sequence and adjacency of pads 16' is not connected in any manner with the sequence and adjacency of the original pads 12. By means of a connection scheme between pads 12 (the original I/O pads) and pads 16 (the relocated I/O pads) of which relocation connections 20, 22 and 24 are examples, the relocated pads 16 (16') can be connected to any of the pads 12. The complexity of the relocation scheme and the therewith of incurred length of interconnection between the original I/O pads and the relocated I/O pads is, needless to say, subject to rules and limitations of electrical behavior and the impact that the I/O relocation interconnection lines have on this electrical behavior. Interconnections that are created between original points of I/O and relocated points of I/O, such as 20, 22, 24 and others, preferably use bond wire.

Figure 4:
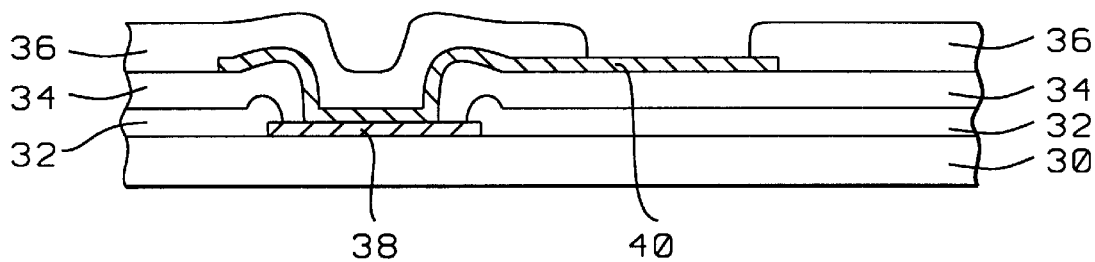
FIG. 4 shows a cross section of a re-routed I/O pad, whereby a layer of polyimide has been provided for I/O pad protection.

FIG. 4 shows a cross section of a re-routed I/O pad whereby a layer of polyimide has been provided for I/O pad protection, this layer of polyimide is deposited over the surface of the relocated pad. The cross section that is shown in FIG. 4 has the following components:

- 30 is a semiconductor layer on the surface of which is formed an assemblage of I/O points
- 32 is a layer of passivation material
- 34 is a first layer of polyimide and forms a thick (and relatively soft) dielectric material
- 36 is a second layer of polyimide
- 38 is the original, not relocated I/O point of connection that has been formed on the surface of layer 30
- 40 is the relocated I/O point of connection that is connected to the I/O pad 38 and as such forms the I/O point of contact that functionally extends I/O point of connection 38.

The preferred method of the invention to connect (external circuitry, not shown in FIG. 4) to the relocated I/O point 40 is the use of bond wires (not shown in FIG. 4).

It must be emphasized that the invention uses thick, soft dielectric material (such as polyimide) for the layers that underlie the relocated I/O pads while the metal layers that are etched overlying this thick soft dielectric material are wide metals, making these etched metals suitable for I/O pads The thick soft material on which the relocated pads are located avoids damage to the underlying devices and structure during wire bonding operations that are performed on the relocated pads.

In order to create semiconductor devices, metal lines of the various layers of conducting lines in a semiconductor device are typically separated by insulating layers such as silicon oxide and oxygen-containing polymers that are deposited using Chemical Vapor Deposition (CVD) techniques. The insulating layers are deposited over patterned layers of interconnecting lines where electrical contact between successive layers of interconnecting lines is established with metal vias created for this purpose in the insulating layers. Electrical contact to the chip is typically established by means of bonding pads that form electrical interfaces with patterned levels of interconnecting metal lines. Signal lines and power/ground lines can be connected to the bonding pads. After the bonding pads have been created on the surfaces of the chip package, the bonding pads are passivated and electrically insulated by the deposition of a passivation layer over the surface of the bonding pads. Passivation layers can contain but are not limited to silicon oxide/silicon nitride ($SiO_2/Si_3N_4$), photosensitive polyimide, titanium nitride or phosphorous doped silicon dioxide deposited by CVD. The passivation layer is patterned and etched to create openings in the passivation layer for the bonding pads after which a second and relatively thick passivation layer is deposited that further insulates and protects the surface of the chips from moisture and other contaminants and from mechanical damage during the final assembling of the chips.

In recent years, photosensitive polyimide has frequently been used for the creation of passivation layers. Photosensitive polyimides have the same characteristics as conventional polyimides but can, in addition, be patterned like a photoresist mask and can, after patterning and etching, remain on the surface on which it has been deposited to serve as a passivation layer. Typically and to improve surface adhesion and tension reduction, a precursor layer is first deposited by, for example, conventional photoresist spin coating. The precursor layer is, after a low temperature pre-bake, exposed using, for example, a step and repeat projection aligner and Ultra Violet (UV) light as a light source. The curing of a polyimide layer can take place at a temperature of 350 degrees C. in a $N_2$ gas environment for a time of 20 hours and a pressure of 760 Torr. The portions of the precursor that have been exposed in this manner are cross linked thereby leaving unexposed regions (that are not cross linked) over the bonding pads. During subsequent development, the unexposed polyimide precursor layer (over the bonding pads) is dissolved thereby providing openings over the bonding pads. A final step of thermal curing leaves a permanent high quality passivation layer of polyimide over the substrate.

The dielectric layers 34 and 36 can, in line with the above indicate process of treating photosensitive polyimides and if these layers are created using polyimide, be cured after deposition and patterning, thereby outgassing solvents contained in the polyimide and enhancing the mechanical strength of the layers of polyimide. The process of curing can be thermal curing, E-beam or UV curing. Curing of a polyimide provides extra protection to the device circuitry. This step is typically a high temperature cure, at 350 to 400 degrees C., in a $N_2$ gas ambient for a time period between about 1.5 and 2.5 hours.

The layer 34 of dielectric is deposited to a thickness within the range of between 5.0 and 9.5 µm. If a polyimide is used for this layer 34, shrinkage of up to 40% of this thickness can occur as a result of the curing of the polyimide.

The process of curing of layers 32 and 34 has to be performed using extreme care and may, in some instances, better not be performed. The curing may harden the layers of dielectric to the point where the benefit of the softness of the layer is negated, resulting in the possibility of damage to this layer at the time of wire bonding to the relocated I/O pad 40.

Conventional semiconductor device processing calls for the deposition of passivation layer over the entire top surface of the wafer. The passivation layer forms an insulating, protective layer that shields and protects the surface that it covers from mechanical and chemical damage during subsequent device assembly and packaging. The passivation layer must therefore have good adhesion to the underlying metal and any level of inter-level dielectric over which it is deposited, it must provide uniform step coverage so as not to hinder subsequent steps of planarization, it must be deposited in a uniform thickness, it must protest against mechanical damage such as surface scratch while it must also protect against moisture penetration, it must not introduce stress related problems while easy patterning of the passivation layer is required. It is clear that, in order to meet the requirements that are placed on the passivation layer; the passivation layer must be thick. In many applications, the passivation layer is therefore created using two depositions of passivation material.

Passivation layers can contain for instance Plasma Enhanced oxide or Plasma Enhanced $Si_3N_4$, deposited using PECVD technology at a temperature between about 350 and 450 degrees C. with a pressure of between about 2.0 and 5.0 Torr for the duration between about 10 and 60 seconds.

The conductive layer 40 can contain metal such as aluminum, copper or aluminum/copper alloys. This metal can be deposited by methods of electroplating, electroless plating, and the like. This cold metal deposition can for instance be a deposition of Al or copper at approximately 200 degrees C. Copper can further be deposited by electroplating or electroless-plating.

Figure 5:
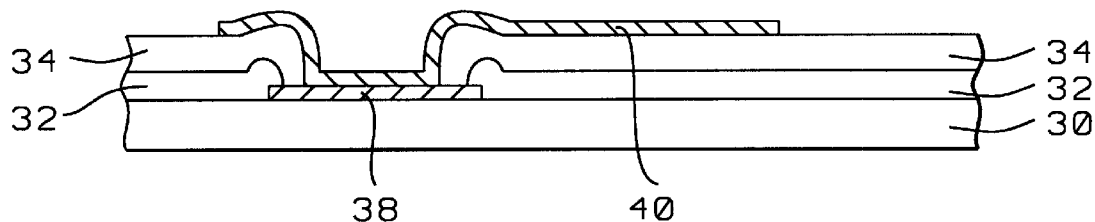
FIG. 5 shows a cross section of a re-routed I/O pad, whereby no layer of polyimide has been provided for I/O pad protection.

FIG. 5 shows a cross section of a re-routed I/O pad whereby the layer of polyimide, that is layer 36 of FIG. 4, has not been provided for protection of the relocated I/O pad 40. This can serve as an intermediary step and can result in cost savings or increased ease of manufacturing logistics in routing the chips through the manufacturing process. The preferred method of the invention to connect the relocated point 40 of I/O with surrounding circuitry is the use of bond wires (not shown in FIG. 5).

A number of salient points that relate to the process of the invention are the following:

- in packaging semiconductor devices, the same package can be used for all devices that have an identical pattern of relocated I/O points of interconnect. By therefore customizing the creation of the relocated I/O pads to a particular semiconductor device, this device can now be mounted in a standardized package using the relocated I/O pads as points of interconnect,
- the process of the invention uses a relatively thick layer of dielectric (layer 34, FIGS. 4 and 5) that overlays the original I/O pad and combines this relatively thick layer of dielectric with the used of relatively wide interconnect lines to create the relocated I/O pads. This approach allows for processes of the invention that can be performed using more cost effective processing equipment in addition to using a processing environment that needs to be less strictly environmentally controlled. Both of these factors make the process of the invention cost effective,
- the process of the invention of I/O pad relocation can be performed after a passivation layer (layer 32 of FIGS. 4 and 5) has been deposited over the surface of the to be relocated I/O pad and before this layer of passivation is patterned for the contact opening to this I/O pad. The device can, because of this, remain in storage for a relatively long period of time, which provides for improved logistics control of the manufacturing process, and
- the relocated I/O pads have been created on the surface of thick, soft material. Wirebonding operations to the relocated I/O pads can therefore be performed without incurring potential damage to underlying devices and structures.

It is clear from the above that the process of the invention in not limited to the examples that have been shown above. The process of the invention lends itself to using soft and thick layers of dielectric material while wide strips of metal can be used for purposes of re-routing the I/O pads. This rerouting enables the easy connection of the I/O pads to different format packages. In addition, the wire bonding pads can be located on the upper surface of a thick layer of material such as polyimide, thereby avoiding potential damage to underlying devices and structures during the process of wire bonding.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of I/O pad relocation that provides a universal I/O pad interface allowing use of a standardized package for packaging of semiconductor devices, the relocated I/O pads being created on the surface of a thick, soft dielectric material such as polyimide, whereby the relocated I/O pads are wide metal pads, comprising the steps of:

providing a semiconductor surface whereby said semiconductor surface has been provided with points of electrical contact therein;

creating a base layer of $SiO_2$ over said semiconductor surface;

depositing a first layer of conductive material over said semiconductor surface;

patterning and etching said first layer of conductive material, creating conductive pads that align with said points of electrical contact provided in said semiconductor surface, providing a conductive interface between said points of electrical contact provided in said semiconductor surface and said patterned and etched second layer of conductive material;

patterning and etching said base layer of $SiO_2$ as an extension of said patterning and etching said first layer of conductive material, using a pattern for this patterning of said base layer that is identical to a pattern used for etching said first layer of conductive material thereby removing said base layer from said semiconductor surface except where said base layer underlies said patterned first layer of conductive material;

attaching at least one bond wire to said conductive pads for further interconnects;

depositing a layer of passivation over said semiconductor surface, including said points of electrical contact;

patterning and etching said layer of passivation, creating openings in said layer of passivation to said points of electrical contact provided in said semiconductor surface;

depositing a first layer of dielectric comprising polyimide or photosensitive polyimide deposited to a thickness between about 5,000 and 10,000 Angstrom over said layer of passivation, including said openings created in said layer of passivation;

patterning and etching said first layer of dielectric, creating openings in said first layer of dielectric that align with said openings in said layer of passivation;

depositing a second layer of conductive material over the surface of said first layer of dielectric, including said openings in said first layer of dielectric;

patterning and etching said second layer of conductive material, creating a pattern of conductive material that is wide and that serves as a bond pad; and providing a wire bond connection to said bond pad for further interconnect.

2. The method of claim 1 wherein said first layer of dielectric is cured after said patterning and etching said first layer of dielectric.

3. The method of claim 1 wherein said second layer of conductive material comprises doped polysilicon.

4. The method of claim 1 wherein said second layer of conductive material comprises an element selected from a group comprising Al, Ti, Ta, W, Mo, Cu or a combination of these materials.

5. The method of claim 1 wherein said second layer of conductive material is selected from a group comprising silicate, a salicide, poly silicon, amorphous silicon or any other semiconductor compatible conductive layer.

6. The method of claim 1 with additional steps to be performed after said step of patterning and etching said second layer of conductive material, comprising:

depositing a second layer of dielectric comprising polyimide or photosensitive polyimide deposited to a thickness between about 5,000 and 10,000 Angstrom over the surface of said first layer of dielectric, including said patterned second layer of conductive material;

patterning and etching said second layer of dielectric thereby creating openings that align with said patterned and etched second layer of conductive material, exposing the surface of said second layer of conductive material; and providing a wire bond connection to said exposed surface of said second layer of conductive material for further interconnect.

7. The method of claim 6 wherein said second layer of dielectric is cured after said patterning and etching said first layer of dielectric.

8. The method of claim 1 wherein said patterning and etching said second layer of conductive material is creating a pattern of conductive material, said pattern of conductive material comprising conductive elements whereby each conductive element of said pattern of conductive material connects with at least one of said points of electrical contact provided in said semiconductor surface by means of at least one bond wire.

9. The method of claim 1 wherein said first layer of conductive material comprises doped polysilicon.

10. The method of claim 1 wherein said first layer of conductive material comprises an element selected from a group comprising Al, Ti, Ta, W, Mo, Cu or a combination of these materials.

11. The method of claim 1 wherein said first layer of conductive material is selected from a group comprising silicate, a salicide, poly silicon, amorphous silicon or any other semiconductor compatible conductive layer.

12. A method of I/O pad relocation that provides a universal I/O pad interface allowing use of a standardized package for packaging of semiconductor devices, the relocated I/O pads being created on the surface of a thick, soft dielectric material such as polyimide, whereby the relocated I/O pads are wide metal pads, said method comprising the steps of:

providing a semiconductor surface whereby said semiconductor surface has been provided with points of electrical contact therein;

creating base layer of SiO$_2$ over said semiconductor surface;

depositing a first layer of conductive material over said semiconductor surface;

patterning and etching said first layer of conductive material, creating a first pattern of conductive pads that align with said points of electrical contact provided in said semiconductor surface;

patterning and etching said base layer of SiO$_2$ as an extension of said patterning and etching said first layer of conductive material, using a pattern for this patterning of said base layer that is identical to a pattern used for etching said first layer of conductive material thereby removing said base layer from said semiconductor surface except where said base layer underlies said patterned first layer of conductive material;

depositing a layer of passivation over said semiconductor surface, including said first pattern of conductive pads;

patterning and etching said layer of passivation, creating openings to said first pattern of conductive pads;

depositing a first layer of dielectric comprising polyimide or photosensitive polyimide deposited to a thickness between about 5,000 and 10,000 Angstrom over said layer of passivation, including said openings created in said layer of passivation;

patterning and etching said first layer of dielectric, creating openings in said first layer of dielectric that align with said openings in said layer of passivation;

depositing a second layer of conductive material over the surface of said first layer of dielectric, including said openings in said first layer of dielectric; and patterning and etching said second layer of conductive material, creating a second pattern of conductive pads that align with said first pattern of conductive pads, creating a pattern of conductive material that is wide and that serves as bond pad;

providing at least one bond wire to said bond pad for further interconnect.

13. The method of claim 12 wherein said first layer of dielectric is cured after said patterning and etching said first layer of dielectric.

14. The method of claim 12 wherein said first or second layer of conductive material comprises doped polysilicon.

15. The method of claim 12 wherein said first or second layer of conductive material comprises an element selected from a group comprising Al, Ti, Ta, W, Mo, Cu or a combination of these materials.

16. The method of claim 12 wherein said first or second layer of conductive material is selected from a group comprising silicate, a salicide, poly silicon, amorphous silicon or any other semiconductor compatible conductive layer.

17. The method of claim 12 with additional steps to be performed after said step of patterning and etching said second layer of conductive material, comprising:

depositing a second layer of dielectric comprising polyimide or photosensitive polyimide deposited to a thickness between about 5,000 and 10,000 Angstrom over the surface of said first layer of dielectric, including said patterned second layer of conductive material;

patterning and etching said second layer of dielectric thereby creating openings in said second layer of dielectric that align with said patterned and etched second layer of conductive material, exposing the surface of said second layer of conductive material; and attaching at least one bond wire to said exposed surface of said conductive material for further interconnect.

18. The method of claim 17 wherein said second layer of dielectric is cured after said patterning and etching said first layer of dielectric.

19. The method of claim 12 wherein said patterning and etching said second layer of conductive material is creating a second pattern of conductive material, said second pattern of conductive material comprising conductive elements whereby at least one conductive element of said second pattern of conductive material connects with at least one of said points of electrical contact provided by said first pattern of conductive pads.

20. A structure for I/O pad relocation that provides a universal I/O pad interface allowing use of a standardized package for packaging of semiconductor devices, the relocated I/O pads being located on the surface of a thick, soft dielectric material such as polyimide, whereby the relocated I/O pads are wide metal pads, said structure comprising:

a semiconductor surface whereby said semiconductor surface has been provided with points of electrical contact therein;

a base layer of SiO$_2$ created over said semiconductor surface;

a patterned and etched first layer of conductive material deposited over said semiconductor surface;

conductive pads that align with said points of electrical contact provided in said semiconductor surface, created by patterning and etching said first layer of conductive material, providing a conductive interface between said points of electrical contact provided in said semiconductor surface and said patterned and etched second layer of conductive material;

said base layer of SiO$_2$ having been patterned and etched as an extension of said patterning and etching said first layer of conductive material, using a pattern for this patterning of said base layer that is identical to a pattern used for etching said first layer of conductive material thereby removing said base layer from said semiconductor surface except where said base layer underlies said patterned first layer of conductive material;

a layer of passivation deposited over said semiconductor surface, including said points of electrical contact;

openings in said layer of passivation to said points of electrical contact provided in said semiconductor surface, said openings created by patterning and etching said layer of passivation;

a first layer of dielectric comprising polyimide or photosensitive polyimide deposited to a thickness between about 5,000 and 10,000 Angstrom deposited over said layer of passivation, including said openings created in said layer of passivation;

openings in said first layer of dielectric that align with said openings in said layer of passivation, created by patterning and etching said first layer of dielectric;

a second layer of conductive material deposited over the surface of said first layer of dielectric, including said openings in said first layer of dielectric;

a pattern of interconnect lines and contact pads created by patterning and etching said second layer of conductive material; and at least one bond wire connected to said contact pads for further interconnect.

21. The structure of claim 20 wherein said first layer of dielectric is cured after said patterning and etching said first layer of dielectric.

22. The structure of claim 21 wherein said second layer of conductive material comprises doped polysilicon.

23. The structure of claim 20 wherein said second layer of conductive material comprises an element selected from a group comprising Al, Ti, Ta, W, Mo, Cu or a combination of these materials.

24. The structure of claim 20 wherein said second layer of conductive material is selected from a group comprising silicate, a salicide, poly silicon, amorphous silicon or any other semiconductor compatible conductive layer.

25. The structure of claim 20 with additional structures provided after said step of patterning and etching said second layer of conductive material, comprising:
- a second layer of dielectric comprising polyimide or photosensitive polyimide deposited to a thickness between about 5,000 and 10,000 Angstrom deposited over the surface of said first layer of dielectric, including said patterned second layer of conductive material; and
- openings that align with said patterned and etched second layer of conductive material, created by patterning and etching said second layer of dielectric, exposing the surface of said second layer of conductive material; and
- at least one bond wire connected to said exposed surface of said second layer of conductive material.

26. The structure of claim 25 wherein said second layer of dielectric is cured after said patterning and etching said first layer of dielectric.

27. The structure of claim 20 wherein said patterning and etching said second layer of conductive material is creating a pattern of conductive material said pattern of conductive material omprising conductive elements whereby each conductive element of said pattern of conductive material connects with at least one of said points of electrical contact provided in said semiconductor surface.

28. The structure of claim 20 wherein said first layer of conductive material comprises doped polysilicon.

29. The structure of claim 20 wherein said first layer of conductive material comprises an element selected from a group comprising Al, Ti, Ta, W, Mo, Cu or a combination of these materials.

30. The structure of claim 20 wherein said first layer of conductive material is selected from a group comprising silicate, a salicide, poly silicon, amorphous silicon or any other semiconductor compatible conductive layer.

* * * * *

UNITED STATES PATENT AND TRADEMARK OFFICE
CERTIFICATE OF CORRECTION

PATENT NO. : 6,593,649 B1
DATED : August 15, 2003
INVENTOR(S) : Mou-Shiung Lin and Joseph Ting It is certified that error appears in the above-identified patent and that said Letters Patent is hereby corrected as shown below:

<u>Title page,</u>
Item [73], please add second assignee -- Etron Technology, Inc., Hsin-Chu (TW) --.

Signed and Sealed this

Second Day of September, 2003

JAMES E. ROGAN
*Director of the United States Patent and Trademark Office*